United States Patent
Shimizu et al.

(10) Patent No.: US 9,685,546 B2
(45) Date of Patent: Jun. 20, 2017

(54) SEMICONDUCTOR DEVICE AND METHOD OF MANUFACTURING THE SAME

(71) Applicant: Kabushiki Kaisha Toshiba, Minato-ku (JP)

(72) Inventors: Tatsuo Shimizu, Shinagawa (JP); Hisashi Saito, Kawasaki (JP)

(73) Assignee: Kabushiki Kaisha Toshiba, Mintao-ku (JP)

( * ) Notice: Subject to any disclaimer, the term of this patent is extended or adjusted under 35 U.S.C. 154(b) by 0 days.

(21) Appl. No.: 15/048,193

(22) Filed: Feb. 19, 2016

(65) Prior Publication Data
US 2016/0284828 A1   Sep. 29, 2016

(30) Foreign Application Priority Data

Mar. 24, 2015  (JP) .................................. 2015-061800

(51) Int. Cl.
*H01L 29/778* (2006.01)
*H01L 29/66* (2006.01)
*H01L 29/51* (2006.01)
*H01L 29/40* (2006.01)
*H01L 29/24* (2006.01)
(Continued)

(52) U.S. Cl.
CPC ........ *H01L 29/7786* (2013.01); *H01L 29/408* (2013.01); *H01L 29/513* (2013.01); *H01L 29/517* (2013.01); *H01L 29/66462* (2013.01); *H01L 29/7788* (2013.01); *H01L 29/0646* (2013.01); *H01L 29/2003* (2013.01); *H01L 29/24* (2013.01); *H01L 29/4236* (2013.01)

(58) Field of Classification Search
CPC .................................................... H01L 29/205
See application file for complete search history.

(56) References Cited

U.S. PATENT DOCUMENTS

2008/0135880 A1   6/2008 Yoshida et al.
2011/0065237 A1*  3/2011 Bennahmias ....... C23C 16/0263
                                                            438/104
(Continued)

FOREIGN PATENT DOCUMENTS

JP   2008-130672   6/2008
JP   2011-205071   10/2011
(Continued)

*Primary Examiner* — Fernando L Toledo
*Assistant Examiner* — Valerie N Newton
(74) *Attorney, Agent, or Firm* — Oblon, McClelland, Maier & Neustadt, L.L.P.

(57) ABSTRACT

A semiconductor device of an embodiment includes a first layer, a second layer provided on the first layer, the second layer forming a two-dimensional electron gas in the first layer; a source electrode provided on the second layer, a drain electrode provided on the second layer, a gate electrode provided between the source electrode and the drain electrode on the second layer and a first insulating layer provided between the gate electrode and the drain electrode on the second layer. The first insulating layer includes a first film, a second film having a higher oxygen density than the first film and a first region provided between the first film and the second film. The first region contains at least one first element selected from the group consisting of F, H, and D, the first region having a first peak of concentration of the first element.

20 Claims, 10 Drawing Sheets

(51) Int. Cl.
  *H01L 29/423*  (2006.01)
  *H01L 29/06*   (2006.01)
  *H01L 29/20*   (2006.01)

(56) References Cited

U.S. PATENT DOCUMENTS

| | | |
|---|---|---|
| 2011/0121313 A1 | 5/2011 | Briere |
| 2011/0254062 A1 | 10/2011 | Shimizu et al. |
| 2012/0326244 A1 | 12/2012 | Suzuki et al. |
| 2013/0256686 A1* | 10/2013 | Kanamura ............ H01L 29/205 257/76 |
| 2016/0233379 A1* | 8/2016 | Qin .................. H01L 29/42316 |
| 2016/0284833 A1 | 9/2016 | Shimizu et al. |

FOREIGN PATENT DOCUMENTS

| | | |
|---|---|---|
| JP | 2011-228429 | 11/2011 |
| JP | 2016-181671 A | 10/2016 |
| WO | WO 2011/089647 A1 | 7/2011 |

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2015-061800, filed on Mar. 24, 2015, the entire contents of which are incorporated herein by reference.

FIELD

Embodiments described herein relate generally to a semiconductor device and a method of manufacturing the same.

BACKGROUND

In circuits such as switching power supplies and inverters, semiconductor elements such as switching elements and diodes are used. These semiconductor elements are required to have high breakdown voltage and low on-resistance. The relationship between breakdown voltage and on-resistance is a trade-off relationship that depends on element materials.

As technologies have advanced, semiconductor elements now have low on-resistance close to the limit for silicon, which is a principal element material. So as to further increase breakdown voltage or further reduce on-resistance, element materials need to be changed. If GaN-based semiconductors such as GaN and AlGaN are used as switching element materials, the trade-off relationship depending on materials can be improved, and dramatically high breakdown voltage and low on-resistance can be achieved.

However, if a high drain voltage is applied to a switching element using a GaN-based semiconductor, a problem called "current collapse" that causes an increase in on-resistance occurs.

DETAILED DESCRIPTION

Figure 1:
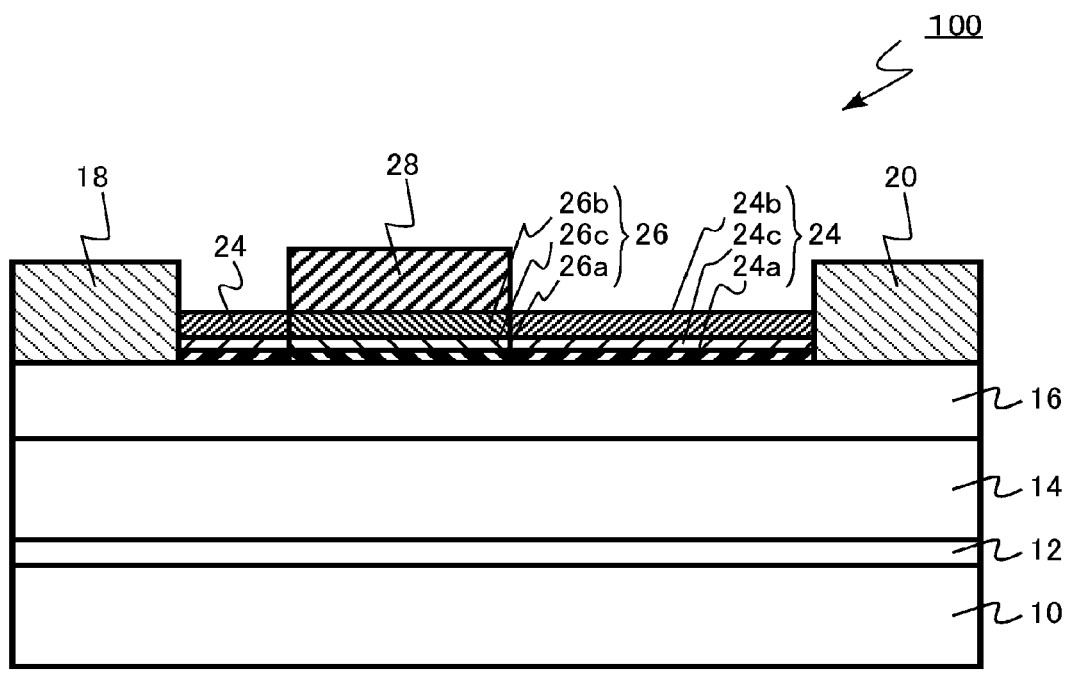
FIG. 1 is a schematic cross-sectional view of a semiconductor device of a first embodiment.
Figure 2:
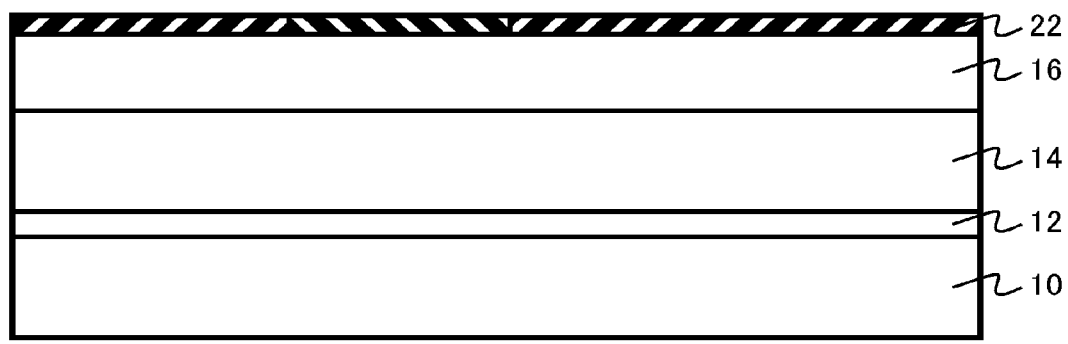
FIG. 2 is a schematic cross-sectional view of a semiconductor device of the first embodiment being manufactured.

A semiconductor device of an embodiment of the present disclosure includes: a first layer; a second layer provided on the first layer, the second layer configured to form a two-dimensional electron gas in the first layer; a source electrode provided on the second layer; a drain electrode provided on the second layer; a gate electrode provided between the source electrode and the drain electrode on the second layer; and a first insulating layer provided between the gate electrode and the drain electrode on the second layer, the first insulating layer including: a first film; a second film having a higher oxygen density than the first film; and a first region provided between the first film and the second film, the first region containing at least one first element selected from the group consisting of F (fluorine), H (hydrogen), and D (deuterium), the first region having a first peak of concentration of the first element.

In this specification, like or similar components are denoted by like reference numerals, and the same explanation is not repeated in some cases.

In this specification, a "GaN-based semiconductor" means a semiconductor containing GaN (gallium nitride), AlN (aluminum nitride), InN (indium nitride), or any intermediate composition of these materials.

In this specification, "undoped" means that an impurity concentration is equal to or lower than $1 \times 10^{15}$ cm$^{-3}$.

In this specification, to indicate the positional relationship among components and the like, the top of each drawing is regarded as the "top", and the bottom of each drawing is regarded as the "bottom". The concepts of "top" and "bottom" in this specification do not necessarily indicate the relationship with the direction of gravitational force.

First Embodiment

A semiconductor device of this embodiment includes: a first layer; a second layer provided on the first layer, the second layer forming a two-dimensional electron gas in the first layer; a source electrode provided on the second layer; a drain electrode provided on the second layer; a gate electrode provided between the source electrode and the drain electrode on the second layer; and a first insulating layer provided between the gate electrode and the drain electrode on the second layer, the first insulating layer including: a first film; a second film having a higher oxygen density than the first film; and a first region provided between the first film and the second film, the first region containing at least one first element selected from the group consisting of F (fluorine), H (hydrogen), and D (deuterium), the first region having a first peak of concentration of the first element.

In this embodiment, the first layer and the second layer are GaN-based semiconductors. The bandgap of the second layer is wider than the bandgap of the first layer.

The semiconductor device of this embodiment further includes a second insulating layer provided between the second layer and the gate electrode, the second insulating layer including: a third film; a fourth film having a higher oxygen density than the third film; and a second region provided between the third film and the fourth film, the second region containing at least one second element selected from the group consisting of N (nitrogen), P (phosphorus), As (arsenic), Sb (antimony), and Bi (bismuth), the second region having a second peak of concentration of the second element.

FIG. 1 is a schematic cross-sectional view of the semiconductor device of this embodiment.

A semiconductor device of this embodiment is a HEMT (High Electron Mobility Transistor) using GaN-based semiconductors.

As shown in FIG. 1, a semiconductor device (HEMT) 100 includes a substrate 10, a buffer layer 12, a channel layer (the first layer) 14, a barrier layer (the second layer) 16, a source electrode 18, a drain electrode 20, a protection layer (a passivation layer, or the first insulating layer) 24, a gate insulating layer (the second insulating layer) 26, and a gate electrode 28.

The protection layer (first insulating layer) 24 includes a first low-oxygen-density film (the first film) 24a, a first high-oxygen-density film (the second film) 24b, and a first interface region (the first region) 24c. The gate insulating layer (second insulating layer) 26 includes a second low-oxygen-density film (the third film) 26a, a second high-oxygen-density film (the fourth film) 26b, and a second interface region (the second region) 26c.

The substrate 10 is formed with silicon (Si), for example. Instead of silicon, it is possible to use sapphire ($Al_2O$) or silicon carbide (SiC), for example.

The buffer layer 12 is provided on the substrate 10. The buffer layer 12 has a function to reduce lattice mismatch between the substrate 10 and the channel layer 14. The buffer layer 12 is formed with a multilayer structure of aluminum gallium nitride ($Al_wGa_{1-w}N$ (0<W<1)), for example.

The channel layer 14 is provided on the buffer layer 12. The channel layer 14 is also called an electron transit layer. The channel layer 14 is undoped $Al_xGa_{1-x}N$ (0≤X>1), for example. More specifically, the channel layer 14 is undoped GaN, for example. The thickness of the channel layer 14 is not smaller than 0.1 μm and not greater than 10 μm, for example.

The barrier layer 16 is provided on the channel layer 14. The barrier layer 16 is also called an electron supply layer. The bandgap of the barrier layer 16 is wider than the bandgap of the channel layer 14. The barrier layer 16 is undoped $Al_YGa_{1-Y}N$ (0<Y≤1, X<Y), for example. More specifically, the barrier layer 16 is undoped $Al_{0.25}Ga_{0.75}N$, for example. The thickness of the barrier layer 16 is not smaller than 10 nm and not greater than 100 nm, for example.

There is a heterojunction interface between the channel layer 14 and the barrier layer 16. A two-dimensional electron gas (2DEG) is formed in channel layer 14 by the heterojunction interface of the HEMT 100, and turns into a carrier.

The source electrode 18 and the drain electrode 20 are formed on the barrier layer 16. The source electrode 18 and the drain electrode 20 are metal electrodes, for example, and each of the metal electrodes is a stack structure formed with titanium (Ti) and aluminum (Al), for example. There are preferably ohmic contacts between the barrier layer 16 and the source and drain electrodes 18 and 20. The distance between the source electrode 18 and the drain electrode 20 is not shorter than 5 μm and not longer than 30 μm, for example.

The gate electrode 28 is provided on a portion of the barrier layer 16 located between the source electrode 18 and the drain electrode 20. The gate electrode 28 is a metal electrode, for example. The metal electrode is formed with titanium nitride (TiN), for example.

The protection layer 24 is provided on part of the surface of the barrier layer 16. The protection layer 24 is provided between the gate electrode 28 and the drain electrode 20, and between the gate electrode 28 and the source electrode 18. The thickness of the protection layer 24 is not smaller than 10 nm and not greater than 100 nm, for example.

The protection layer 24 includes the first low-oxygen-density film (first film) 24a, the first high-oxygen-density film (second film) 24b, and the first interface region (first region) 24c. The oxygen density in the first high-oxygen-density film (second film) 24b is higher than the oxygen density in the first low-oxygen-density film (first film) 24a.

The first low-oxygen-density film 24a and the first high-oxygen-density film 24b are oxides or oxynitrides, for example. The materials of the first low-oxygen-density film 24a and the first high-oxygen-density film 24b are materials selected from the group consisting of silicon oxide, aluminum oxide, hafnium oxide, zirconium oxide, hafnium aluminum oxide, zirconium aluminum oxide, hafnium silicate, and zirconium silicate, for example.

The first low-oxygen-density film 24a is a silicon oxide film, for example, and the first high-oxygen-density film 24b is a high-permittivity film having a higher permittivity than silicon oxide, for example.

The first interface region 24c is provided between the first low-oxygen-density film 24a and the first high-oxygen-density film 24b. The first interface region 24c contains at least one first element selected from the group consisting of F (fluorine), H (hydrogen), and D (deuterium), and has a first peak of the concentration of the first element.

The full width at half maximum of the first peak of the concentration of the first element is preferably not greater than 1 nm, and more preferably, not greater than 0.5 nm. The first element is segregated in the interface between the first low-oxygen-density film 24a and the first high-oxygen-density film 24b. The first element is bound to the metal element forming the first high-oxygen-density film 24b having a high oxygen density.

The concentration in a position at a distance of 1 nm or longer from the peak of the concentration of the first element should be sufficiently low, and is preferably not higher than $1\times10^{18}$ $cm^{-3}$. The concentrations of elements can be measured by SIMS, and more preferably, should not be higher than the detection limits of respective elements (approximately $1\times10^{17}$ $cm^{-3}$ or lower).

The maximum concentration of the first element at the first peak is preferably not lower than $4\times10^{19}$ $cm^3$ and not higher than $6.4\times10^{22}$ $cm^{-3}$. The amount of the negative fixed charge in the first interface region 24c is preferably 1/10 or less of the amounts of the positive fixed charge in the first interface region 24c.

The oxygen density, and the concentration and the distribution of the first element can be measured by SIMS (Secondary Ion Mass Spectrometry), for example.

The gate insulating layer 26 is provided between the barrier layer 16 and the gate electrode 28.

The gate insulating layer (second insulating layer) 26 includes the second low-oxygen-density film (third film) 26a, the second high-oxygen-density film (fourth film) 26b, and the second interface region (second region) 26c.

The second low-oxygen-density film 26a and the second high-oxygen-density film 26b are oxides or oxynitrides, for example. The materials of the second low-oxygen-density film 26a and the second high-oxygen-density film 26b are materials selected from the group consisting of silicon oxide, aluminum oxide, hafnium oxide, zirconium oxide, hafnium aluminum oxide, zirconium aluminum oxide, hafnium silicate, and zirconium silicate, for example.

The second low-oxygen-density film 26a is a silicon oxide film, for example, and the second high-oxygen-density film 26b is a high-permittivity film having a higher permittivity than silicon oxide, for example.

The second interface region 26c is provided between the second low-oxygen-density film 26a and the second high-oxygen-density film 26b. The second interface region 26c contains at least one second element selected from the group consisting of N (nitrogen), P (phosphorus), As (arsenic), Sb (antimony), and Bi (bismuth), and has a second peak of the concentration of the second element.

The full width at half maximum of the second peak of the concentration of the second element is preferably not greater than 1 nm, and more preferably, not greater than 0.5 nm. The second element is segregated in the interface between the second low-oxygen-density film 26a and the second high-oxygen-density film 26b. The second element is bound to the metal element forming the second high-oxygen-density film 26b having a high oxygen density.

The concentration in a position at a distance of 1 nm or longer from the peak of the concentration of the second element should be sufficiently low, and is preferably not higher than $1 \times 10^{18}$ cm$^{-3}$. The concentrations of elements can be measured by SIMS, and more preferably, should not be higher than the detection limits of respective elements (approximately $1 \times 10^{17}$ cm$^{-3}$ or lower).

The maximum concentration of the second element at the second peak is preferably not lower than $4 \times 10^{19}$ cm$^{-3}$ and not higher than $6.4 \times 10^{22}$ cm$^{-3}$. The amount of the positive fixed charge in the second interface region 26c is preferably 1/10 or less of the amount of the negative fixed charge in the second interface region 26c.

The oxygen density, and the concentration and the distribution of the second element can be measured by SIMS (Secondary Ion Mass Spectrometry), for example.

The first low-oxygen-density film 24a and the second low-oxygen-density film 26a are preferably made of the same material, and the first high-oxygen-density film 24b and the second high-oxygen-density film 26b are preferably made of the same material. This is because, with this arrangement, the protection layer 24 and the gate insulating layer 26 can be more readily manufactured through a series of manufacturing procedures.

Next, an example of a semiconductor device manufacturing method according to this embodiment is described. FIGS. 2 through 6 are schematic cross-sectional views of a semiconductor device of this embodiment being manufactured.

In the example case described below, the first low-oxygen-density film 24a and the second low-oxygen-density film 26a are silicon oxide ($SiO_2$), the first high-oxygen-density film 24b and the second high-oxygen-density film 26b are hafnium oxide ($HfO_2$), the first element is F (fluorine), and the second element is N (nitrogen).

A method of manufacturing a semiconductor device of this embodiment includes: forming a first film on a first layer and a second layer provided on the first layer, the second layer forming a two-dimensional electron gas in the first layer; introducing, into a predetermined region of the first film, at least one element (the second element) selected from the group consisting of N (nitrogen), P (phosphorus), As (arsenic), Sb (antimony), and Bi (bismuth); introducing, into a region of the first film other than the predetermined region, at least one element (the first element) selected from the group consisting of F (fluorine), H (hydrogen), and D (deuterium); forming a second film on the first film, the second film having a higher oxygen density than the first film; and forming a gate electrode on the predetermined region of the second film.

First, the substrate 10 such as a Si substrate is prepared. The buffer layer 12 is then grown on the Si substrate through epitaxial growth, for example. The buffer layer 12 is grown by metalorganic chemical vapor deposition (MOCVD), for example.

On the buffer layer 12, undoped GaN to be the channel layer (first layer) 14 and undoped $Al_{0.25}Ga_{0.75}N$ to be the barrier layer (second layer) 16 are formed through epitaxial growth. The channel layer 14 and the barrier layer 16 are grown by MOCVD, for example.

A silicon oxide film (first film) 22 is then formed on the barrier layer 16. The silicon oxide film 22 is formed by CVD (Chemical Vapor Deposition), for example.

Figure 3:
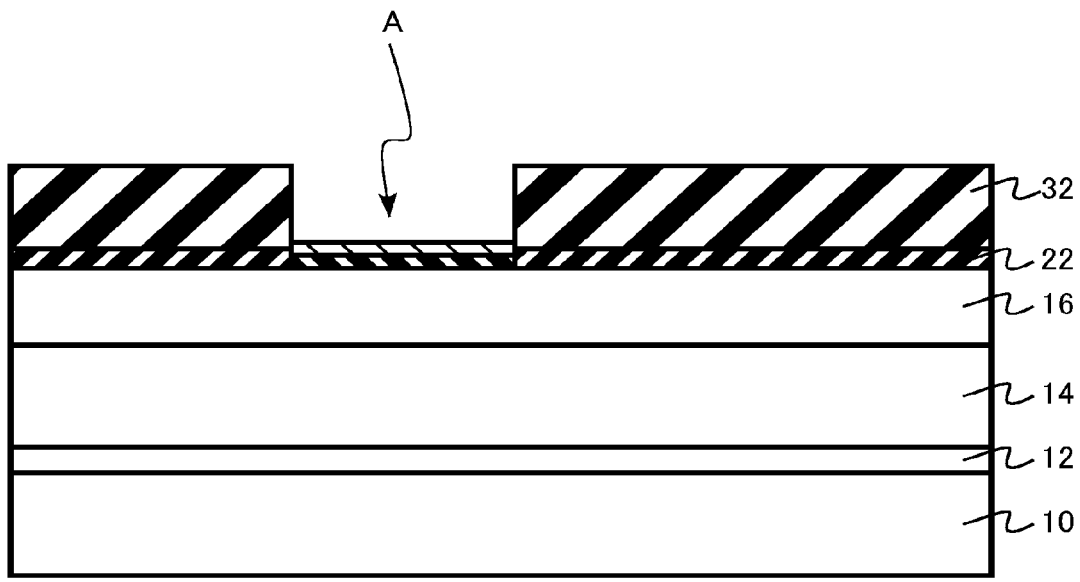
FIG. 3 is a schematic cross-sectional view of the semiconductor device of the first embodiment being manufactured.

A mask material 32 having an opening in a predetermined region A is then formed on the silicon oxide film 22. The mask material 32 is a photoresist, for example. With the mask material 32 serving as a mask, a nitriding treatment is performed in nitrogen plasma at room temperature. Through this nitriding treatment, N (nitrogen) is introduced into the predetermined region A of the silicon oxide film 22 (FIG. 3).

If an element other than nitrogen, which is P, As, Sb, or Bi, is introduced, a plasma state at appropriate room temperature for each of these elements should be used.

According to some other method, it is also possible to use a hydride ($NH_3$, $PH_3$, $AsH_3$, or $BiH_3$), or a fluoride ($NF_3$, $PF_3$, $AsF_3$, or $BiF_3$). According to yet another effective method, after a stacked insulating layer is formed, a mask is formed, and ions of N, P, As, Sb, or Bi are implanted and are piled up in the interface through thermal diffusion. By virtue of the mask, N, P, As, Sb, or Bi can be introduced into a local position.

The mask material 32 is then removed, and a mask material 34 having an opening in the region B other than the predetermined region A is formed on the silicon oxide film 22. The mask material 34 is a photoresist, for example.

Figure 4:
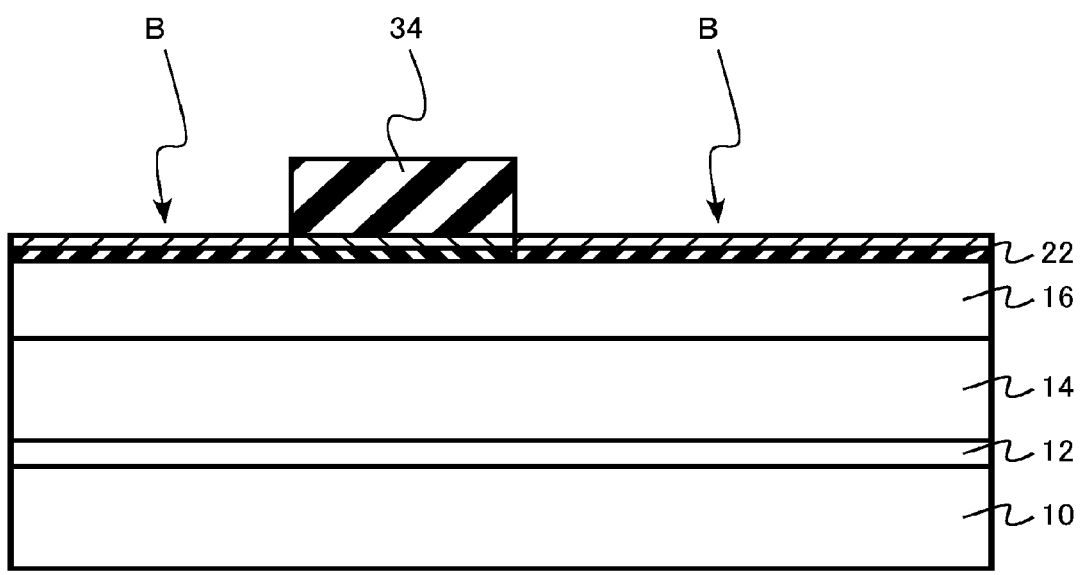
FIG. 4 is a schematic cross-sectional view of the semiconductor device of the first embodiment being manufactured.

With the mask material 34 serving as a mask, a fluorinating treatment is performed in fluorine plasma at room temperature. Through this fluorinating treatment, F (fluorine) is introduced into the region B of the silicon oxide film 22 other than the predetermined region A (FIG. 4). Later, the gate insulating layer 26 will be formed in the predetermined region A, and the protection layer 24 will be formed in the region B other than the predetermined region A.

If an element other than fluorine, which is H or D, is introduced, a plasma state at appropriate room temperature for each of these elements should be used. According to yet another effective method, after a stacked insulating layer is formed, a mask is formed, and ions of F, H, or D are implanted and are piled up in the interface through thermal diffusion. By virtue of the mask, F, H, or D can be introduced into a local position.

Figure 5:
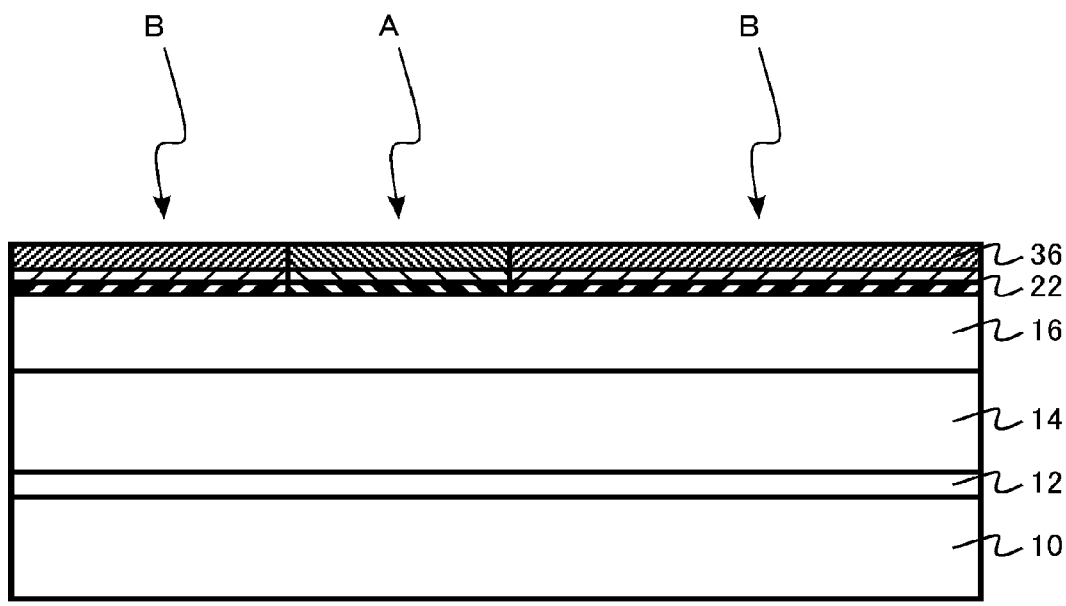
FIG. 5 is a schematic cross-sectional view of the semiconductor device of the first embodiment being manufactured.

The mask material 34 is then removed, and a hafnium oxide film (the second film) 36 is formed on the silicon oxide film 22. The hafnium oxide film 36 is formed by CVD, for example (FIG. 5).

N (nitrogen) is segregated in the interface between the silicon oxide film 22 and the hafnium oxide film 36 in the predetermined region A. F (fluorine) is segregated in the interface between the silicon oxide film 22 and the hafnium oxide film 36 in the region B other than predetermined region A.

Figure 6:
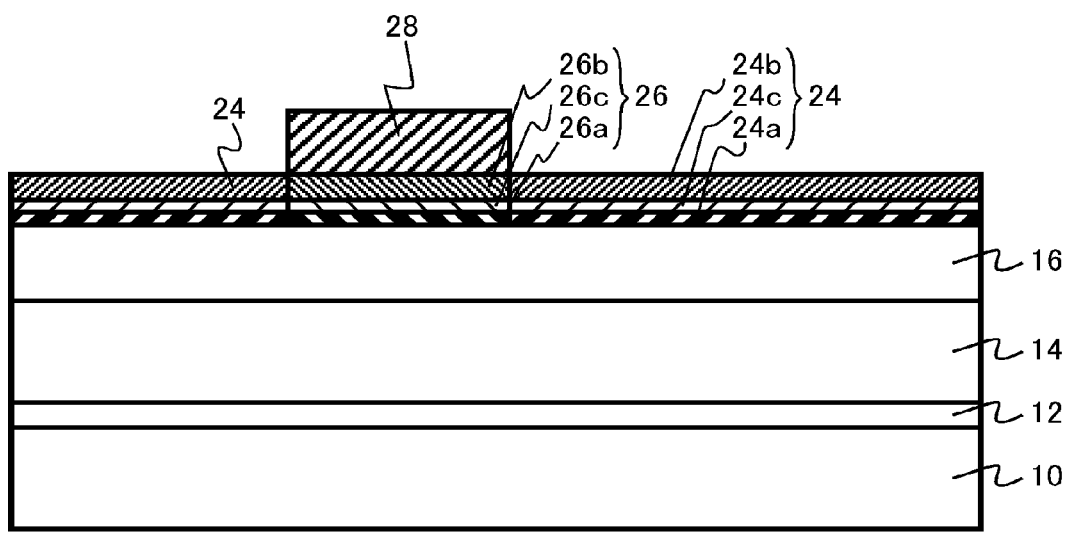
FIG. 6 is a schematic cross-sectional view of the semiconductor device of the first embodiment being manufactured.

The gate electrode 28 is then formed on the predetermined region A of the hafnium oxide film 36 (FIG. 6). After that, the source electrode 18 and the drain electrode 20 are formed on the barrier layer 16 by a known technique.

The drain electrode 20 is formed so that the region B other than the predetermined region A is interposed between the gate electrode 28 and the drain electrode 20. The source electrode 18 is formed so that the region B other than the predetermined region A is interposed between the gate electrode 28 and the source electrode 18.

By the above described manufacturing method, the HEMT 100 shown in FIG. 1 is formed.

Next, the functions and the effects of a semiconductor device of this embodiment are described.

Figure 7:
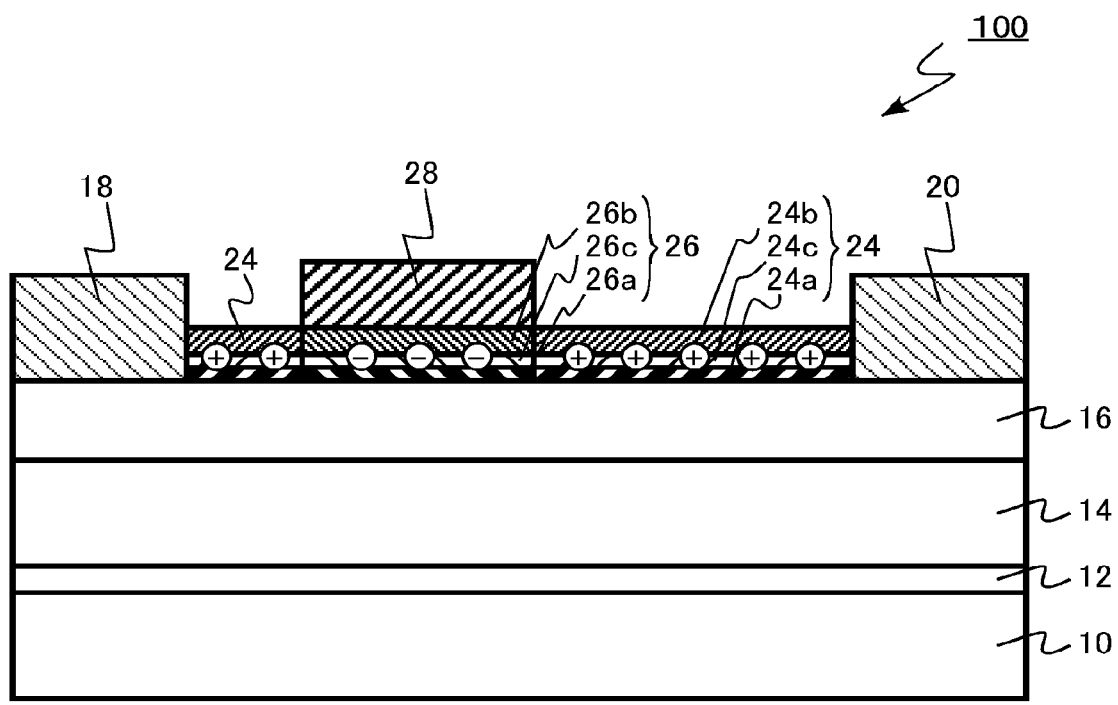
FIG. 7 is a diagram for explaining the functions and the effects of a semiconductor device of the first embodiment.

FIG. 7 is a diagram for explaining the functions and the effects of a semiconductor device of this embodiment.

A GaN-based HEMT has a problem called "current collapse", with which on-resistance becomes higher when a high drain voltage is applied. It is considered that "current collapse" occurs primarily due to electrons trapped in a portion of the protection layer located between the gate electrode and the drain electrode. That is, as electrons are trapped in the protection layer or in an interface between the protection layer and the substrate, the potential of the heterojunction interface changes and the two-dimensional electron gas density becomes lower. It is considered that, as a result of the above, on-resistance becomes higher.

Also, in a GaN-based HEMT, a two-dimensional electron gas is generated even under the gate electrode. Therefore, "normally-on operation" that allows conduction without any voltage applied to the gate is normally performed. Particularly, in a HEMT involving a large amount of power, "normally-off operation" that does not allow conduction unless voltage is applied to the gate is required for safety reasons.

As shown in FIG. 7, in the HEMT 100 of this embodiment, the first interface region 24c of the protection layer 24 holds positive fixed charge.

Oxygen defects are easily formed in the interface between the first low-oxygen-density film 24a and the first high-oxygen-density film 24b, which have different oxygen densities. As a result of a first principle calculation performed by the inventors, it has become clear that, when F (fluorine), H (hydrogen), or D (deuterium) is introduced into the interface in which such oxygen defects are formed, F (fluorine), H (hydrogen), or D (deuterium) enters the oxygen defects and releases electrons, and stabilization is achieved. Accordingly, as F (fluorine), H (hydrogen), or D (deuterium) is introduced, positive fixed charge stably exists in the interface.

As the first interface region 24c of the protection layer 24 holds a sufficient amount of positive fixed charge, the potential variation in the heterojunction interface due to electrons trapped in the protection layer 24 or in the interface between the protection layer 24 and the barrier layer 16 can be reduced. Accordingly, current collapse can be restrained.

The maximum concentration of at least one first element that is selected from the group consisting of F (fluorine), H (hydrogen), and D (deuterium), and is contained in the first interface region 24c of the protection layer 24 is preferably not lower than $4 \times 10^{19}$ cm$^{-3}$ and not higher than $6.4 \times 10^{22}$ cm$^{-3}$. If the concentration is below the above mentioned range, current collapse might not be sufficiently restrained. Also, it is difficult to introduce the above element into the first interface region 24c at a concentration above the range.

Further, so as to increase the effect to restrain current collapse, the concentration of the above element (first element) is preferably not lower than $1 \times 10^{20}$ cm$^{-3}$, and more preferably, not lower than $5 \times 10^{20}$ cm$^{-3}$.

Also, as shown in FIG. 7, in the HEMT 100 of this embodiment, the gate insulating layer 26 holds negative fixed charge in the second interface region 26c.

Oxygen defects are easily formed in the interface between the second low-oxygen-density film 26a and the second high-oxygen-density film 26b, which have different oxygen densities. As a result of a first principle calculation performed by the inventors, it has become clear that, when N (nitrogen), P (phosphorus), As (arsenic), Sb (antimony), or Bi (bismuth) is introduced into the interface in which such oxygen defects are formed, N (nitrogen), P (phosphorus), As (arsenic), Sb (antimony), or Bi (bismuth) enters the oxygen defects and receives electrons, and stabilization is achieved.

Accordingly, as N (nitrogen), P (phosphorus), As (arsenic), Sb (antimony), or Bi (bismuth) is introduced, negative fixed charge stably exists in the interface.

As the gate insulating layer 26 holds a sufficient amount of negative fixed charge in the second interface region 26c, the threshold voltage of the HEMT can be made higher. Accordingly, normally-off operation of the HEMT 100 can be realized.

The maximum concentration of at least one second element that is selected from the group consisting of N (nitrogen), P (phosphorus), As (arsenic), Sb (antimony), and Bi (bismuth), and is contained in the second interface region 26c of the gate insulating layer 26 is preferably not lower than $4 \times 10^{19}$ cm$^{-3}$ and not higher than $6.4 \times 10^{22}$ cm$^{-3}$.

If the concentration is below the above mentioned range, there is a possibility that normally-off operation will not be realized. Also, it is difficult to introduce the above element into the second interface region 26c at a concentration above the range.

Further, so as to make the threshold voltage higher, the concentration of the above element (second element) is preferably not lower than $1 \times 10^{20}$ cm$^{-3}$, and more preferably, not lower than $5 \times 10^{20}$ cm$^{-3}$.

With a semiconductor device of this embodiment, current collapse can be restrained while normally-off operation is realized. Also, according to a method of manufacturing a semiconductor device of this embodiment, current collapse can be restrained while normally-off operation is realized through a simple process.

(First Modification)

Figure 8:
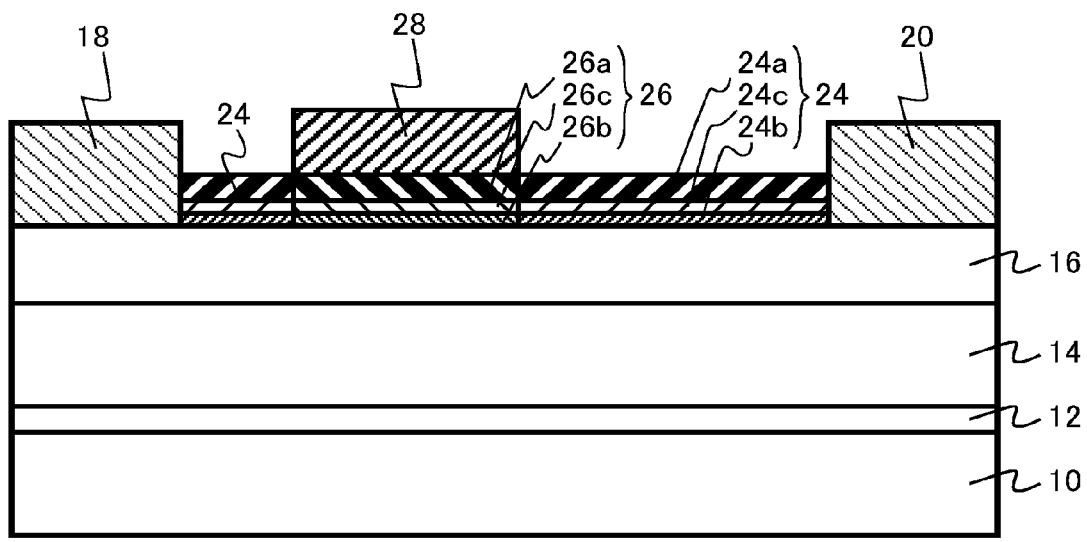
FIG. 8 is a schematic cross-sectional view of a semiconductor device as a first modification of the first embodiment.

FIG. 8 is a schematic cross-sectional view of a semiconductor device as a first modification of this embodiment. This modification differs from the embodiment in that the first low-oxygen-density film (first film) 24a and the first high-oxygen-density film (second film) 24b of the protection layer (first insulating layer) 24 switch places, and the second low-oxygen-density film (third film) 26a and the second high-oxygen-density film (fourth film) 26b of the gate insulating layer (second insulating layer) 26 switch places. In this modification, current collapse can also be restrained while normally-off operation is realized. According to a method of manufacturing a semiconductor device of this modification, current collapse can also be restrained while normally-off operation is realized through a simple process.

(Second Modification)

Figure 9:
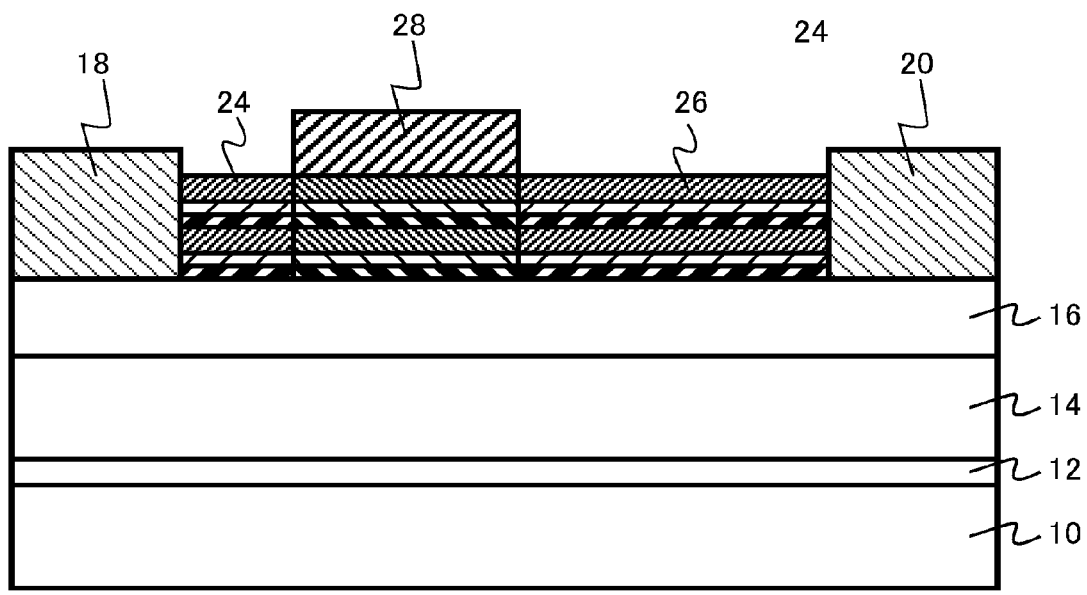
FIG. 9 is a schematic cross-sectional view of a semiconductor device as a second modification of the first embodiment.

FIG. 9 is a schematic cross-sectional view of a semiconductor device as a second modification of this embodiment. This modification differs from the embodiment in that the protection layer (first insulating layer) 24 and a gate insulating layer (the second insulating layer) form a multi-layer structure. According to this modification, the amount of fixed charge can be increased by increasing the number of interface regions. According to this modification, the threshold voltage of a HEMT can be made even higher than that in the embodiment.

Alternatively, a nitride film such as a SiN film may be inserted between the first low-oxygen-density film 24a and the barrier layer 16.

Second Embodiment

A semiconductor device of this embodiment is the same as that of the first embodiment, except that the gate insulating layer is not a stacked film but a single-layer film. Therefore, the same explanations as those in the first embodiment will not be repeated.

Figure 10:
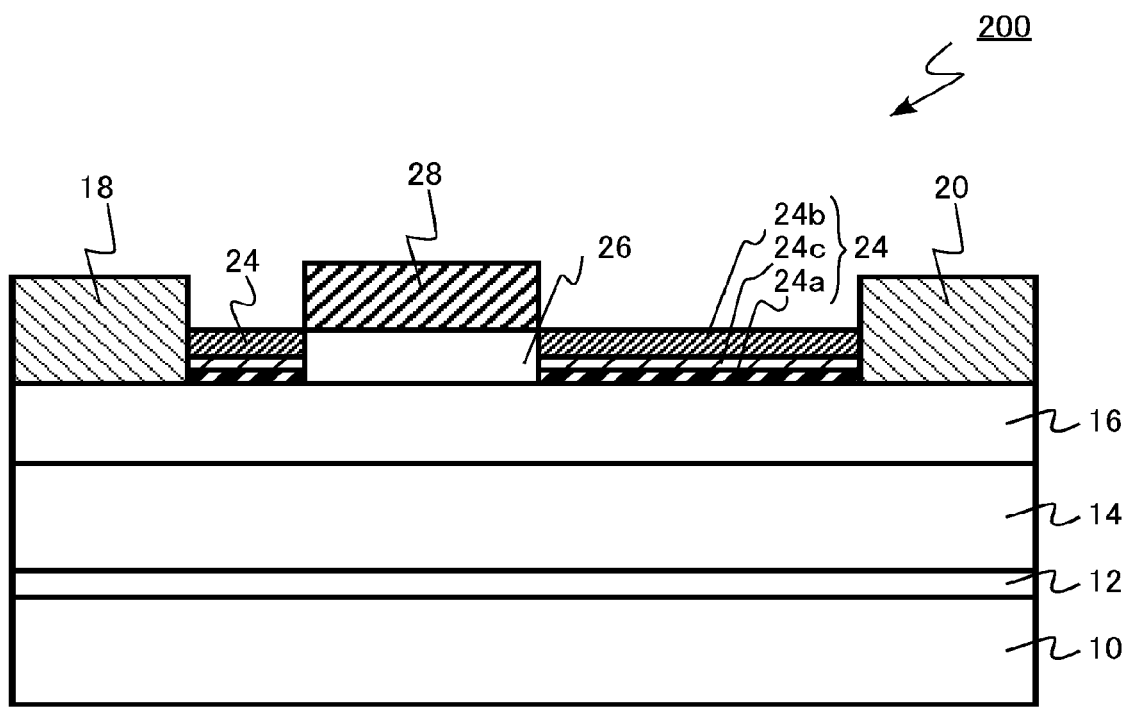
FIG. 10 is a schematic cross-sectional view of a semiconductor device of a second embodiment.

FIG. 10 is a schematic cross-sectional view of a semiconductor device of this embodiment.

In a semiconductor device (HEMT) 200, the gate insulating layer 26 is a single-layer film of silicon oxide.

On the other hand, the protection layer 24 includes a first low-oxygen-density film (the first film) 24a, a first high-oxygen-density film (the second film) 24b, and a first interface region (the first region) 24c, as in the first embodiment.

In the HEMT 200 of this embodiment, the protection layer 24 holds positive fixed charge. Accordingly, with a semiconductor device of this embodiment, current collapse can be restrained.

Third Embodiment

A semiconductor device of this embodiment is the same as that of the first embodiment, except that the protection layer is not a stacked film but a single-layer film. Therefore, the same explanations as those in the first embodiment will not be repeated.

Figure 11:
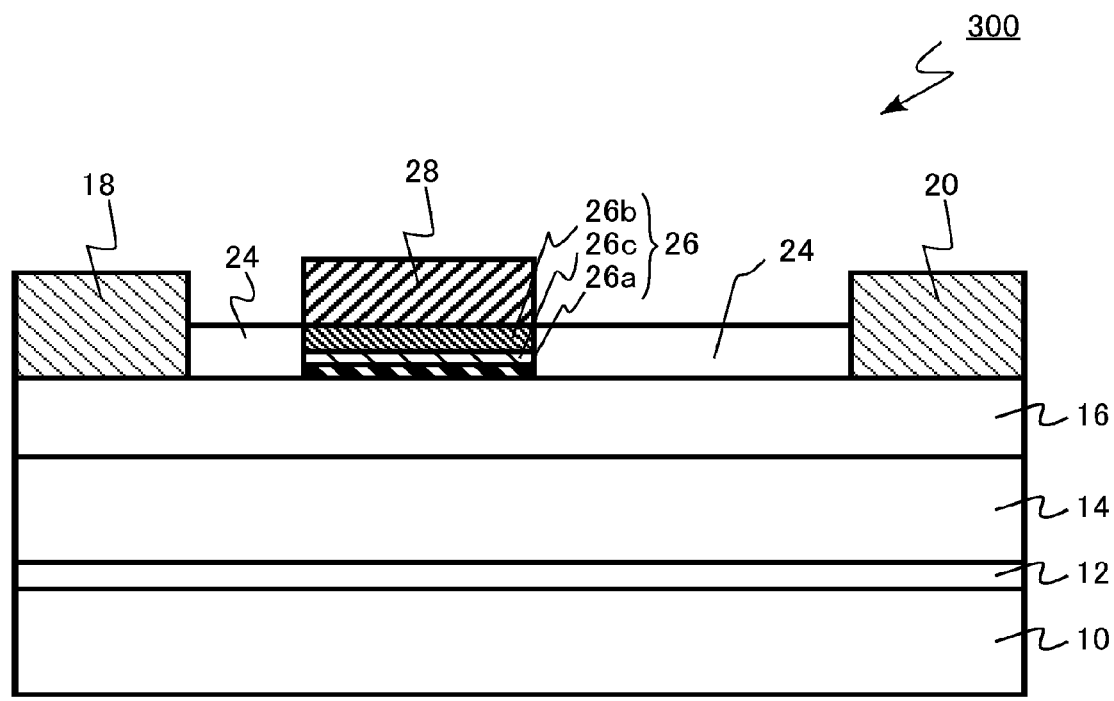
FIG. 11 is a schematic cross-sectional view of a semiconductor device of a third embodiment.

FIG. 11 is a schematic cross-sectional view of the semiconductor device of this embodiment.

In a semiconductor device (HEMT) 300, the protection layer 24 is a single-layer film of silicon oxide.

On the other hand, the gate insulating layer 26 includes a second low-oxygen-density film (the third film) 26a, a second high-oxygen-density film 26b, and a second interface region (the second region) 26c.

In the HEMT 300 of this embodiment, the gate insulating layer 26 holds negative fixed charge. Accordingly, with a semiconductor device of this embodiment, normally-off operation is realized.

Fourth Embodiment

A semiconductor device of this embodiment is the same as a semiconductor device of the first embodiment, except for having a so-called gate recess structure in which the gate electrode is buried in a recess formed in the second layer. Therefore, the same explanations as those in the first embodiment will not be repeated.

Figure 12:
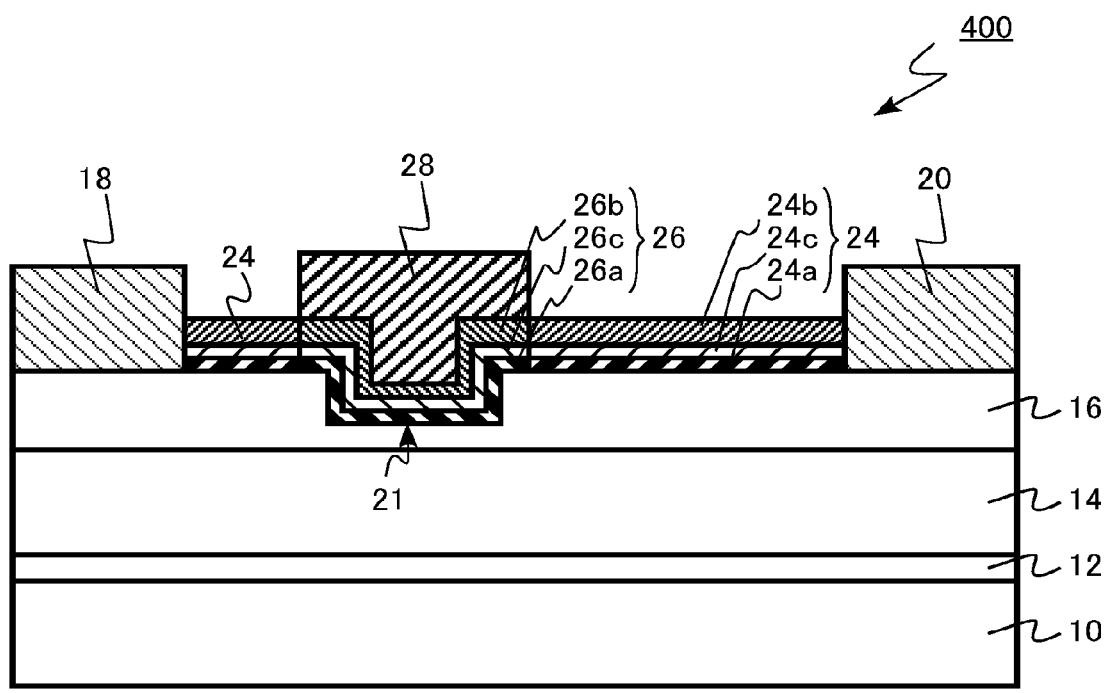
FIG. 12 is a schematic cross-sectional view of a semiconductor device of a fourth embodiment.

FIG. 12 is a schematic cross-sectional view of a semiconductor device of this embodiment.

A semiconductor device (HEMT) 400 has the gate insulating layer 26 formed on the inner surface of a recess 21 formed in a portion of the barrier layer (second layer) 16 located between the source electrode 18 and the drain electrode 20. The bottom portion of the recess 21 is located in the barrier layer 16.

With a semiconductor device of this embodiment, current collapse can be restrained while normally-off operation is realized, as in the first embodiment. Also, as a gate recess structure is provided, normally-off operation can be more readily realized.

Fifth Embodiment

A semiconductor device of this embodiment differs from a semiconductor device of the first embodiment in being a vertical device. The same explanations as those in the first embodiment will not be repeated.

Figure 13:
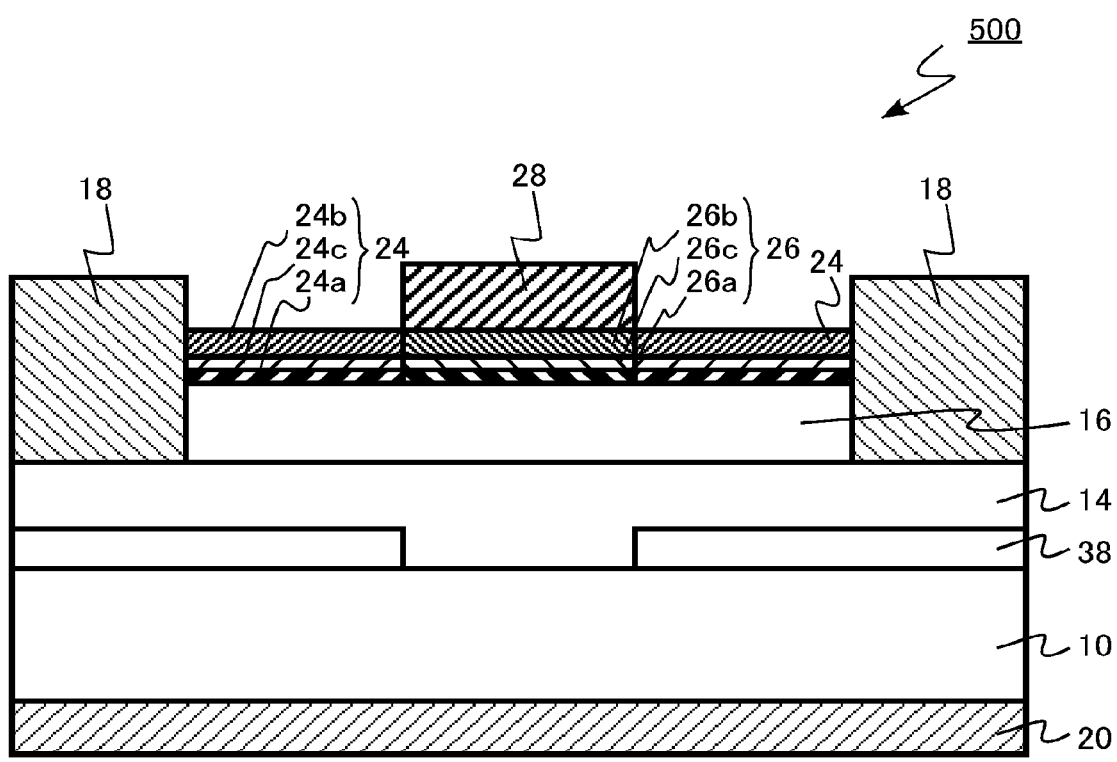
FIG. 13 is a schematic cross-sectional view of a semiconductor device of a fifth embodiment.

FIG. 13 is a schematic cross-sectional view of a semiconductor device of this embodiment.

A semiconductor device of this embodiment is a vertical HEMT using a GaN-based semiconductor that has the drain electrode on the back surface side of the substrate.

As shown in FIG. 13, a semiconductor device (HEMT) 500 includes a substrate 10, a channel layer (the first layer) 14, a barrier layer (the second layer) 16, a source electrode 18, a drain electrode 20, a protection layer (a passivation layer, or the first insulating layer) 24, a gate insulating layer (the second insulating layer) 26, a gate electrode 28, and a p-type GaN layer 38.

The drain electrode 20 is provided on the back surface side of the substrate 10. The channel layer 14 is an n-type doped GaN layer. Drain current flows vertically in the channel layer 14.

As a manufacturing method, it is possible to employ a method of epitaxially growing p-GaN on GaN and reversing it to the n-type by ion implantation. Alternatively, p-GaN and n-GaN may be epitaxially grown in this order on GaN, and the p-GaN may be partially reversed to the n-type by ion implantation. AlGaN is then formed thereon, so that a 2DEG is formed.

With a semiconductor device of this embodiment, the protection layer 24 holds positive fixed charge, and the gate insulating layer 26 holds negative fixed charge. Accordingly, the characteristics of the vertical HEMT can be improved.

Sixth Embodiment

A semiconductor device of this embodiment differs from a semiconductor device of the first embodiment in that the first layer and the second layer are formed with oxides. The same explanations as those in the first embodiment will not be repeated.

Figure 14:
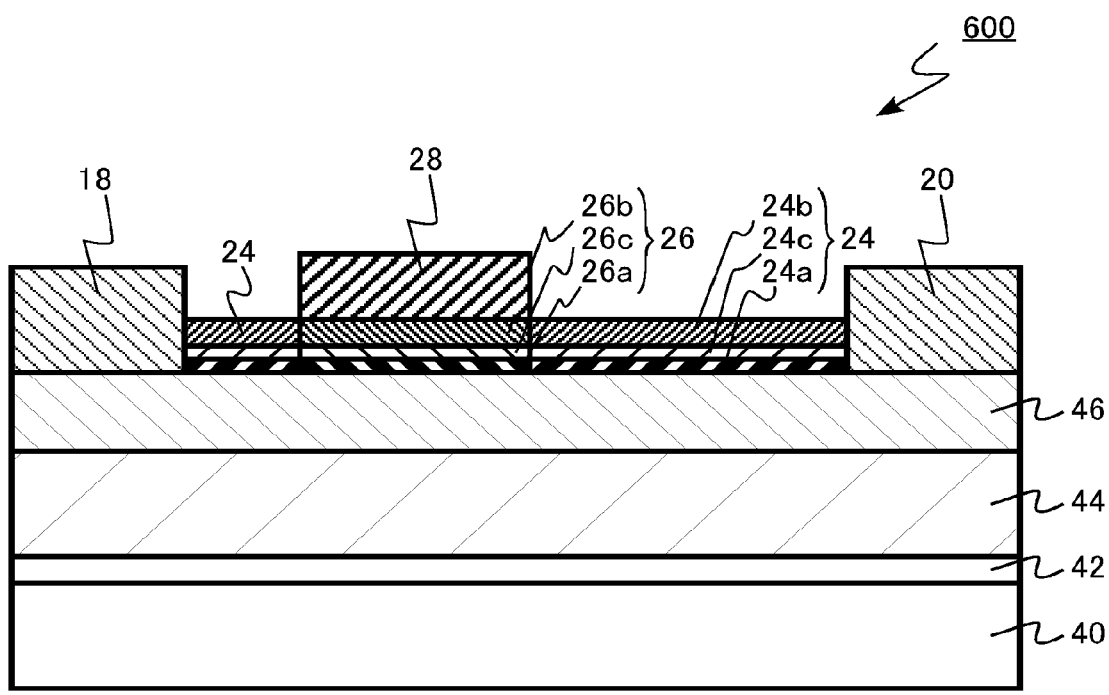
FIG. 14 is a schematic cross-sectional view of a semiconductor device of a sixth embodiment.

FIG. 14 is a schematic cross-sectional view of a semiconductor device of this embodiment.

A semiconductor device of this embodiment is a HEMT in which the channel layer (first layer) and the barrier layer (second layer) are formed with oxides.

As shown in FIG. 14, a semiconductor device (HEMT) 600 includes a substrate 40, a buffer layer 42, a channel layer (the first layer) 44, a barrier layer (the second layer) 46, a source electrode 18, a drain electrode 20, a protection layer (a passivation layer, or the first insulating layer) 24, a gate insulating layer (the second insulating layer) 26, and a gate electrode 28.

The substrate 40 is formed with $n^+$-type silicon (Si), for example. The buffer layer 42 is formed with TiAlN, for example.

The channel layer 44 is formed with $SrTiO_3$, for example. The barrier layer 46 is formed with $LaAlO_3$, for example.

There is a heterojunction interface between the channel layer 44 and the barrier layer 46. A two-dimensional electron gas (2DEG) is formed in the channel layer 44 by the heterojunction interface of the HEMT 600, and turns into a carrier.

The source electrode and the drain electrode are preferably formed with Nb-doped $SrTiO_3$, La-doped $SrTiO_3$, or the like. The gate electrode is preferably formed with $SrRuO_3$ or the like. These electrodes can be formed by CVD or through sputter film formation. As for the manufacturing method, both $SrTiO_3$ and $LaAlO_3$ can be epitaxially grown by CVD.

With a semiconductor device of this embodiment, current collapse can be restrained while normally-off operation is realized, as in the first embodiment.

In the above described embodiments, GaN and AlGaN are used as the materials of GaN-based semiconductor layers. However, it is also possible to use InGaN, InAlN, or InAlGaN, which contains indium (In), for example. Further, it is also possible to use AlN as the material of a GaN-based semiconductor layer.

Also, in the above described embodiments, the film having the higher oxygen density is on the upper side. However, the film having the higher oxygen density may be located on the lower side or on the substrate side.

Although undoped AlGaN is used as the barrier layer in the above described embodiments, it is also possible to use n-type AlGaN.

A conventional charge trapping film requires a charge injection operation, but the charge injection can be performed advantageously at high density. With a conventional charge trapping film, charge is released as time passes, and the threshold voltage becomes lower, resulting in a problem. This means that the trap state is not very stable.

In the above described embodiments, on the other hand, negative fixed charge or positive fixed charge can be formed in a stable manner in the gate insulating layer. The fixed charge is very stable, and does not exit from the insulating layer. The only problem is that the trap amount cannot be made very large. However, this problem can be solved by stacking more layers and increasing density.

While certain embodiments have been described, these embodiments have been presented by way of example only, and are not intended to limit the scope of the inventions. Indeed, a semiconductor device and a method of manufacturing the same described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first layer;
a second layer provided on the first layer, the second layer configured to form a two-dimensional electron gas in the first layer;
a source electrode provided on the second layer;
a drain electrode provided on the second layer;
a gate electrode provided between the source electrode and the drain electrode on the second layer; and
a first insulating layer provided in cross-sectional view between a lateral boundary of the gate electrode and a lateral boundary of the drain electrode on the second layer, the first insulating layer including: a first film; a second film having a higher oxygen density than the first film; and a first region provided between the first film and the second film, the first region containing at least one first element selected from the group consisting of F (fluorine), H (hydrogen), and D (deuterium), the first region having a first peak of concentration of the first element.

2. The device according to claim 1, wherein
the first layer and the second layer are GaN-based semiconductors, and
the second layer has a wider bandgap than a bandgap of the first layer.

3. The device according to claim 1, wherein the first layer and the second layer are oxides.

4. The device according to claim 1, wherein a full width at half maximum of the first peak is 1 nm or smaller.

5. The device according to claim 1, wherein maximum concentration of the first element at the first peak is not lower than $4 \times 10^{19}$ $cm^{-3}$ and not higher than $6.4 \times 10^{22}$ $cm^{-3}$.

6. The device according to claim 1, wherein each of the first film and the second film includes a material selected from the group consisting of silicon oxide, aluminum oxide, hafnium oxide, zirconium oxide, hafnium aluminum oxide, zirconium aluminum oxide, hafnium silicate, and zirconium silicate.

7. The device according to claim 1, wherein an amount of negative fixed charge in the first region is 1/10 or less of an amount of positive fixed charge in the first region.

8. The device according to claim 1, further comprising
a second insulating layer provided in cross-sectional view vertically between the second layer and the gate electrode, the second insulating layer including: a third film; a fourth film having a higher oxygen density than the third film; and a second region provided between the third film and the fourth film, the second region containing at least one second element selected from the group consisting of N (nitrogen), P (phosphorus), As (arsenic), Sb (antimony), and Bi (bismuth), the second region having a second peak of concentration of the second element.

9. The device according to claim 8, wherein a full width at half maximum of the second peak is 1 nm or smaller.

10. The device according to claim 8, wherein maximum concentration of the second element at the second peak is not lower than $4 \times 10^{19}$ $cm^{-3}$ and not higher than $6.4 \times 10^{22}$ $cm^{-3}$.

11. The device according to claim 8, wherein an amount of positive fixed charge in the second region is 1/10 or less of an amount of negative fixed charge in the second region.

12. The device according to claim 8, wherein each of the third film and the fourth film includes a material selected from the group consisting of silicon oxide, aluminum oxide, hafnium oxide, zirconium oxide, hafnium aluminum oxide, zirconium aluminum oxide, hafnium silicate, and zirconium silicate.

13. The device according to claim 8, wherein
the first film and the third film are made of the same material, and
the second film and the fourth film are made of the same material.

14. A semiconductor device comprising:
a first layer;
a second layer provided on the first layer, the second layer configured to form a two-dimensional electron gas in the first layer;
a source electrode provided on the second layer;
a drain electrode provided on the second layer;
a gate electrode provided between the source electrode and the drain electrode on the second layer; and
an insulating layer provided in cross-sectional view vertically between the second layer and the gate electrode, the insulating layer including: a first film; a second film having a higher oxygen density than the first film; and
a region provided between the first film and the second film, the region containing at least one element selected from the group consisting of N (nitrogen), P (phosphorus), As (arsenic), Sb (antimony), and Bi (bismuth), the region having a peak of concentration of the element.

15. The device according to claim 14, wherein
the first layer and the second layer are GaN-based semiconductors, and
the second layer has a wider bandgap than a bandgap of the first layer.

16. The device according to claim 14, wherein the first layer and the second layer are oxides.

17. The device according to claim 14, wherein a full width at half maximum of the peak is 1 nm or smaller.

18. The device according to claim 14, wherein maximum concentration of the element at the peak is not lower than $4 \times 10^{19}$ cm$^{-3}$ and not higher than $6.4 \times 10^{22}$ cm$^{-3}$.

19. A method of manufacturing a semiconductor device, comprising:

forming a first film on a second layer provided on a first layer, the second layer configured to form a two-dimensional electron gas in the first layer;

introducing, into a predetermined region of the first film, at least one element selected from the group consisting of N (nitrogen), P (phosphorus), As (arsenic), Sb (antimony), and Bi (bismuth);

introducing, into a region of the first film not including the predetermined region, at least one element selected from the group consisting of F (fluorine), H (hydrogen), and D (deuterium);

forming a second film on the first film, the second film having a higher oxygen density than the first film; and forming a gate electrode on the predetermined region of the second film.

20. The method according to claim 19, wherein
the first layer and the second layer are GaN-based semiconductors, and
the second layer has a wider bandgap than a bandgap of the first layer.

* * * * *